(12) United States Patent
Yagishita

(10) Patent No.: US 7,755,104 B2
(45) Date of Patent: Jul. 13, 2010

(54) FINFET PMOS DOUBLE GATE SEMICONDUCTOR DEVICE WITH UNIAXIAL TENSILE STRAIN APPLIED TO CHANNEL BY SHRINKABLE GATE ELECTRODE MATERIAL, CURRENT FLOW IN <110> CRYSTAL ORIENTATION, AND SOURCE AND DRAIN SCHOTTKY CONTACTS WITH CHANNEL AND MANUFACTURING METHOD THEREOF

(75) Inventor: Atsushi Yagishita, Somers, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 253 days.

(21) Appl. No.: 11/790,389

(22) Filed: Apr. 25, 2007

(65) Prior Publication Data

US 2007/0252211 A1    Nov. 1, 2007

(30) Foreign Application Priority Data

Apr. 26, 2006    (JP)    ............................. 2006-122503

(51) Int. Cl.
*H01L 29/04*    (2006.01)
*H01L 21/84*    (2006.01)

(52) U.S. Cl. ........................ 257/192; 257/255; 257/351; 257/485; 257/486; 257/616; 257/627; 257/628; 257/E29.004; 257/E21.7

(58) Field of Classification Search ................... 257/192
See application file for complete search history.

(56) References Cited

U.S. PATENT DOCUMENTS 4,693,409 A * 9/1987 Mizunoya et al. ........ 228/122.1

(Continued)

FOREIGN PATENT DOCUMENTS

JP    2005-294789    10/2005

OTHER PUBLICATIONS

Collaert et al., "Performance improvement of tall triple gate devices with strained SiN layers", Electron Devices Letters IEEE (Nov. 2005) vol. 26, Issue 11, pp. 820-882.*

(Continued)

*Primary Examiner*—Marcos D Pizarro
*Assistant Examiner*—Raj Gupta
(74) *Attorney, Agent, or Firm*—Finnegan, Henderson, Farabow, Garrett & Dunner, L.L.P.

(57)    ABSTRACT

A semiconductor device that has a pMOS double-gate structure, has a substrate, the crystal orientation of the top surface of which is (100), a semiconductor layer that is made of silicon or germanium, formed on the substrate such that currents flow in a direction of a first <110> crystal orientation, and channels are located at sidewall of the semiconductor layer, a source layer that is formed on the substrate adjacent to one end of the semiconductor layer in the direction of first <110> crystal orientation and is made of a metal or metal silicide to form a Schottky junction with the semiconductor layer; a drain layer that is formed on the substrate adjacent to the other end of the semiconductor layer in the direction of first <110> crystal orientation and is made of a metal or metal silicide to form a Schottky junction with the semiconductor layer; a gate electrode that is formed on the semiconductor layer in a direction of a second <110> crystal orientation perpendicular to the current flow direction, and a gate insulating film that is disposed between the semiconductor layer and the gate electrode, wherein a uniaxial tensile strain is applied to the semiconductor layer in the direction of the second <110> crystal orientation perpendicular to the current flow direction.

12 Claims, 18 Drawing Sheets

U.S. PATENT DOCUMENTS

2005/0242376 A1* 11/2005 Chen et al. .................. 257/214
2007/0052027 A1* 3/2007 Ke et al. ..................... 257/351

OTHER PUBLICATIONS

Yagishita et al.; "Schottky Barrier Height Reduction and Drive Current Improvement in Metal Source/Drain MOSFET With Strained-Si Channel"; Japanese Journal of Applied Physics, vol. 43, No. 4B, pp. 1713-1716, (2004).

Kedierski et al.; "Complementary Silicide Source/Drain Thin-Body MOSEFETs for the 20NM Gate Length Regime"; International Electron Device Meeting Technical Digest, pp. 57-60, (2000).

* cited by examiner

FINFET PMOS DOUBLE GATE SEMICONDUCTOR DEVICE WITH UNIAXIAL TENSILE STRAIN APPLIED TO CHANNEL BY SHRINKABLE GATE ELECTRODE MATERIAL, CURRENT FLOW IN <110> CRYSTAL ORIENTATION, AND SOURCE AND DRAIN SCHOTTKY CONTACTS WITH CHANNEL AND MANUFACTURING METHOD THEREOF

CROSS-REFERENCE TO RELATED APPLICATION

This application is based upon and claims the benefit of priority from the prior Japanese Patent Application No. 2006-122503, filed on Apr. 26, 2006, the entire contents of which are incorporated herein by reference.

BACKGROUND OF THE INVENTION

1. Field of the Invention

The present invention relates to a semiconductor device and a method of manufacturing a semiconductor device with a double-gate structure.

2. Background Art

For scaling down the physical dimension of MOS transistors, lower power and higher speed, double-gate transistors, for example, FinFET have been proposed (see Japanese Patent Laid-Open Publication No. 2005-294789, for example).

This structure has following advantages.

(1) The structure with two gates reduces the short channel effect and the punch through leakage between the source and the drain.

(2) The small effective electric field in the direction vertical to the channel can improve the carrier mobility.

(3) The off current is reduced. Therefore, the channel width (fin height or number of fins) can be increased accordingly, and thus, the current can be increased.

Furthermore, there has been proposed the Schottky source/drain transistor technique in which the source region and the drain region of a transistor are formed by a metal layer instead of an impurity diffusion layer (see Jakub Kedzierski et al., IEDM Technical digest, pp. 57-60, (2000), for example).

In this structure, the parasitic resistance is reduced in the source region and the drain region, and a shallow junction (Schottky junction) is formed.

In addition, since no impurity is used in the source and the drain, the high-temperature heat treatment for activation is not necessary. Therefore, the manufacturing process can be substantially simplified, and the LSI manufacturing cost can be reduced.

Furthermore, there is a Schottky barrier at the end of the source. Therefore, the off current can be reduced, and the short channel effect can be suppressed (the transistor can be downsized).

In particular, in the case of a Ge channel transistor, the solid solubility of the dopant is low, and the dopant is likely to diffuse. Therefore, the Schottky junction is preferable for the source/drain structure.

However, this transistor has a problem that the Schottky contact resistance (the interface resistance of the silicon/silicide or the metal) has to be reduced.

One solution to this problem is a work function control technique for the source/drain material. For example, a metal or silicide (ErSi$_2$, for example) with a low work function for the source and drain of an nMOS transistor and a metal or silicide (PtSi, for example) with a high work function for the source and drain of a pMOS transistor have been proposed (see Jakub Kedzierski et al., IEDM Technical digest, pp. 57-60, (2000), for example).

According to this technique, the Schottky barrier height of the nMOS transistor can be reduced to about 0.28 eV, and the height of the Schottky barrier of the PMOS transistor can be reduced to about 0.22 eV.

That is, in the nMOS transistor and the pMOS transistor, metal silicide source and drain having a relatively low Schottky contact resistance can be formed.

However, it is not enough to provide a sufficiently high current, and the Schottky barrier height has to be further reduced.

Besides, it is difficult to further reduce the Schottky barrier height only by controlling the work function of the metal, because of the Fermi-level-pinning effect.

Thus, there has been proposed a combination technique using strained channel and Schottky junction. This is a technique that uses a strain (mechanical stress) to reduce the Schottky barrier height and the contact resistance (see A. Yagishita, T-J. King, and J. Bokor, "Schottky Barrier Height Reduction and Drive Current Improvement in Metal Source/Drain MOSFET with Strained-Si Channel", Jpn. J. Appl. Phys., Vol. 43, No. 4B, pp. 1713-1716, (2004), for example).

Furthermore, another technique, channel strain engineering, has been developed to improve the carrier mobility. For a planar pMOSFET, a compressive strain applied from SiGe embedded into the source and drain regions is effective. For a planar nMOSFET, it is known that it is effective to apply, to the channel, a tensile strain from SiC embedded into the source region and the drain region or a tensile strain from a film with a tensile strain deposited on the gate, the source and the drain.

As described above, according to the conventional techniques (the strained channel technique and the Schottky source/drain technique), in the case of the nMOS transistor, a tensile strain is used, so that the mobility is improved, and the Schottky barrier height is reduced.

That is, the driving current of the Schottky source/drain nMOS FinFET can be increased by a simple combination of conventional techniques.

However, according to the conventional techniques described above, a compressive strain is used for the pMOS transistor, and therefore, the Schottky barrier cannot be reduced, although the carrier mobility can be improved.

Thus, the driving current of the Schottky source/drain pMOS FinFET cannot be increased.

SUMMARY OF THE INVENTION

According to one aspect of the present invention, there is provided: a semiconductor device that has a pMOS double-gate structure, comprising a substrate, the crystal orientation of the top surface of which is (100), a semiconductor layer that is made of silicon or germanium, formed on the substrate such that currents flow in a direction of a first <110> crystal orientation, and channels are located at sidewall of the semiconductor layer, a source layer that is formed on the substrate adjacent to one end of the semiconductor layer in the direction of first <110> crystal orientation and is made of a metal or metal silicide to form a Schottky junction with the semiconductor layer;

a drain layer that is formed on the substrate adjacent to the other end of the semiconductor layer in the direction of first <110> crystal orientation and is made of a metal or metal silicide to form a Schottky junction with the semiconductor layer;

a gate electrode that is formed on the semiconductor layer in a direction of a second <110> crystal orientation perpendicular to the current flow direction, and a gate insulating film that is disposed between the semiconductor layer and the gate electrode, wherein a uniaxial tensile strain is applied to the semiconductor layer in the direction of the second <110>crystal orientation perpendicular to the current flow direction.

According to another aspect of the present invention, there is provided: a method of manufacturing a semiconductor device having a PMOS double-gate structure, comprising forming an insulating film on silicon or germanium layer formed on a substrate, the crystal orientation of the top surface of which is (100), selectively etching silicon or germanium to form a fin that extends in a direction of a first <110> crystal orientation, forming a gate insulating film on a side wall of the fin, forming a polysilicon layer that that extends in a direction of a second <110> crystal orientation perpendicular to the direction of the first <110> crystal orientation on a part of the insulating film on channel region, removing the insulating film exposed on the fin, selectively siliciding a part of the fin from which the insulating film is removed, thereby forming, in the fin, a source layer and a drain layer that form Schottky junctions with the semiconductor layer;

and selectively siliciding the polysilicon layer to form a gate electrode made of a shrinkable material.

According to still further aspect of the present invention, there is provided: a method of manufacturing a semiconductor device having a pMOS double-gate structure, comprising forming an insulating film on silicon or germanium formed on a substrate, the crystal orientation of the top surface of which is (100), selectively etching silicon or germanium to form a fin that extends in a direction of a first <110> crystal orientation, forming a gate insulating film on a side wall of the fin, forming a polysilicon layer that extends in a direction of a second <110> crystal orientation perpendicular to the direction of the first <110> crystal orientation on a part of the insulating film on channel region, forming insulating gate side walls on side walls of the polysilicon layer, removing the insulating film exposed on the fin, selectively siliciding a part of the fin where the insulating film is removed, thereby forming, in the fin, a source layer and a drain layer, Schottky junctions is formed between source/drain and the semiconductor layer, depositing an interlayer insulating film and etching back the interlayer insulating film to expose the top surface of the polysilicon layer, selectively removing the polysilicon layer, and filling a shrinkable material into a gate groove defined by the gate side walls to form a gate electrode.

BRIEF DESCRIPTION OF THE DRAWINGS

FIG. 4I is a perspective view for illustrating step of a method of manufacturing the semiconductor device 100 according to the embodiment 1 of the present invention;

DETAILED DESCRIPTION

In the following, embodiments of the present invention will be described with reference to the drawings.

Embodiment 1

Figure 1A:
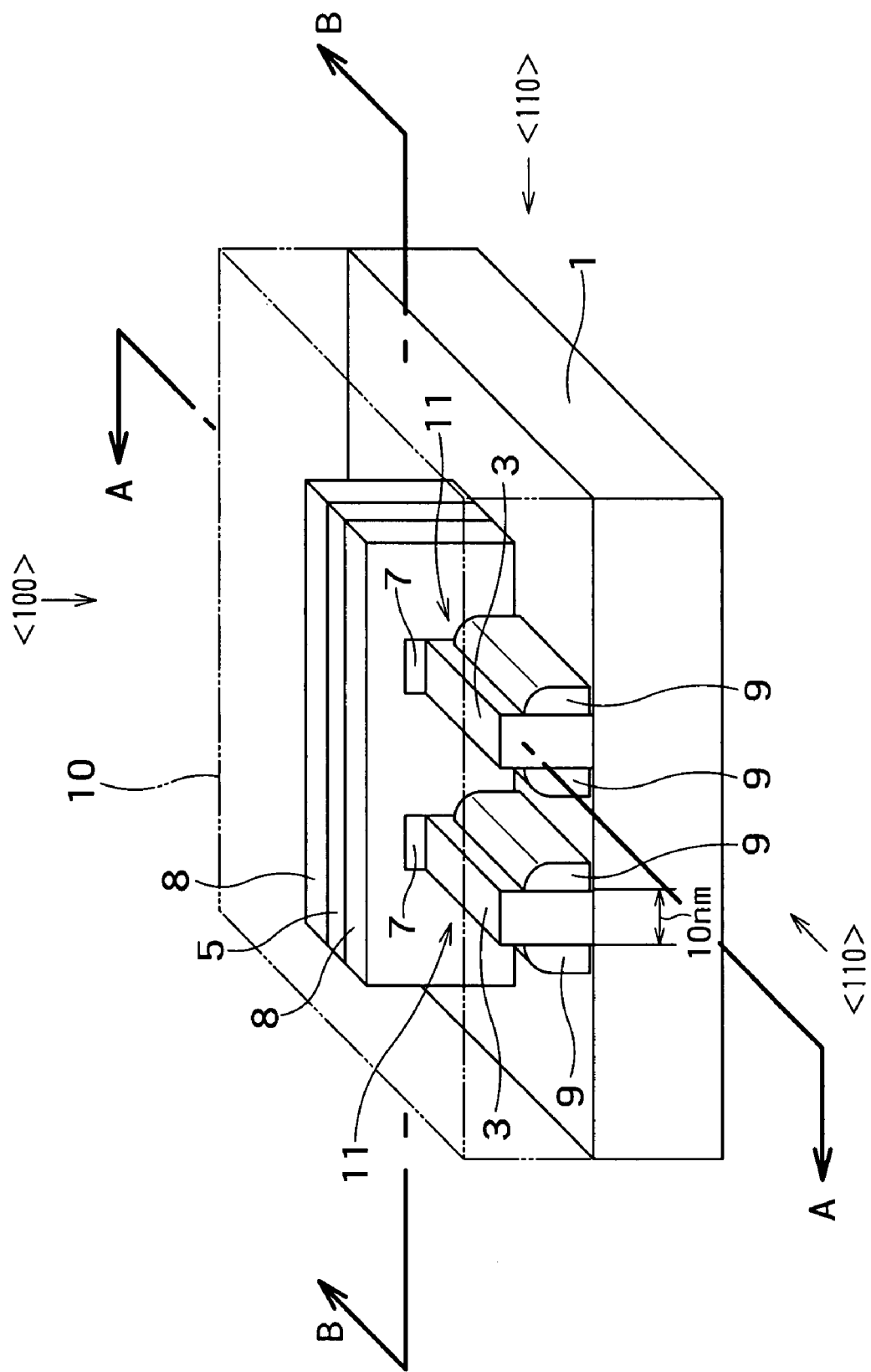
FIG. 1A is a perspective view showing a configuration of essential parts of a semiconductor device according to an embodiment 1 of the present invention.
Figure 1B:
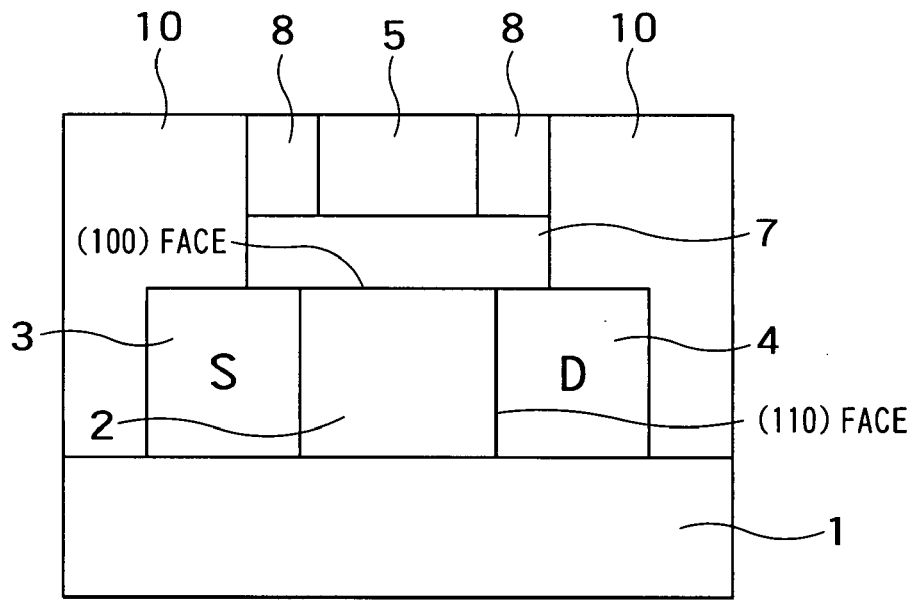
FIG. 1B is a cross-sectional view of the semiconductor device 100 taken along the line A-A in FIG. 1A.
Figure 1C:
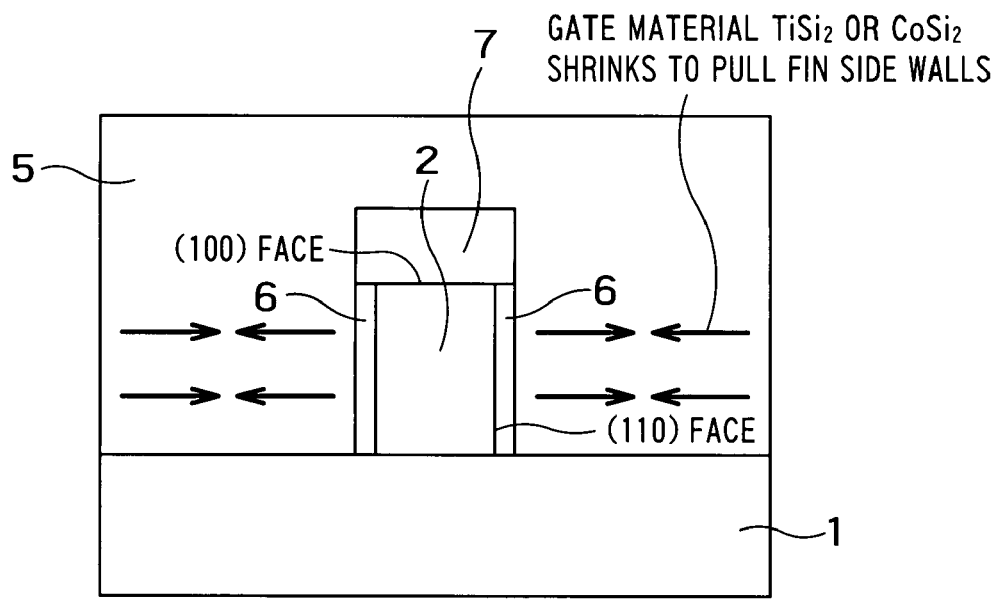
FIG. 1C is a cross-sectional view of the semiconductor device 100 taken along the line B-B in FIG. 1A.

FIG. 1A is a perspective view showing a configuration of essential parts of a semiconductor device according to an embodiment 1 of the present invention. FIG. 1B is a cross-sectional view of the semiconductor device 100 taken along the line A-A in FIG. 1A. FIG. 1C is a cross-sectional view of the semiconductor device 100 taken along the line B-B in FIG. 1A.

As shown in FIGS. 1A to 1C, the semiconductor device 100 has a pMOS double-gate structure and has a substrate 1 that the crystal orientation of the top surface of which is (100), an n-type semiconductor layer 2 that is made of silicon (Si) or germanium (Ge) containing an impurity, the crystal orientation of the top surface of which is (100), and is formed on the substrate 1 to extend in a first <110> crystal orientation (a first <110> direction), and channels are located at sidewall of the semiconductor layer 2.

The substrate 1 is a buried oxide (BOX) of SOI wafer or bulk silicon, for example. In the case where the semiconductor layer 2 is made of silicon, for example, the substrate 1 may be a silicon-on-insulator (SOI) substrate. Alternatively, the semiconductor layer 2 is made of germanium, for example, the substrate 1 may be a germanium-on-insulator (GOI) substrate.

Furthermore, the semiconductor device 100 has a source layer 3 that is formed on the substrate 1 adjacent to one end of the semiconductor layer 2 in the first <110> direction and is made of a metal or metal silicide that forms a Schottky junction with the semiconductor layer 2, and a drain layer 4 that is formed on the substrate 1 adjacent to the other end of the semiconductor layer 2 in the first <110> direction and is made of a metal or metal silicide that forms a Schottky junction with the semiconductor layer 2.

The semiconductor layer 2, the source layer 3 and the drain layer 4 constitute a fin 11 with the double-gate structure.

Furthermore, the semiconductor device 100 has a gate electrode 5 that is formed on the substrate 1 and the semiconductor layer 2 to be adjacent to the side walls of the semiconductor layer 2 and to extend in a second <110> crystal orientation (a second <110> direction) perpendicular to the current flow direction in the semiconductor layer 2, gate insulating films 6 that are disposed between the semiconductor layer 2 and the gate electrode 5, and an insulating film 7 that is disposed between the top surface of the semiconductor layer 2 and the gate electrode 5 and is made of SiN, for example.

The gate electrode 5 contains a shrinkable material, and due to its compaction (decrease of volume), a uniaxial tensile strain is applied to the side walls of the semiconductor layer 2 in the second <110> direction perpendicular to the current flow direction. The shrinkable material may be $TiSi_2$ or $CoSi_2$, for example.

For applying the uniaxial tensile strain to the side walls of the semiconductor layer 2 in the second <110> direction perpendicular to the current flow direction, it is only necessary that the gate electrode 5 is formed on substrate 1 to form a double-gate structure.

In addition, gate side walls 8, such as a tetraethoxysilane (TEOS) film ($SiO_2$ formed by using TEOS), are formed on the side walls of the gate electrode 5.

In addition, fin side walls 9, such as a tetraethoxysilane (TEOS) film, are formed on the side walls of the source layer 3 and the drain layer 4.

In addition, the semiconductor device 100 has an interlayer insulating film 10, such as a TEOS film, formed on the substrate 1 for insulating the components described above.

Now, there will be described a reason why the structure described above is used for the Schottky source/drain pMOS double-gate transistor.

First, there will be described a reason why a tensile strain is used to cause a strain in the channel in the structure described above.

Figure 2A:
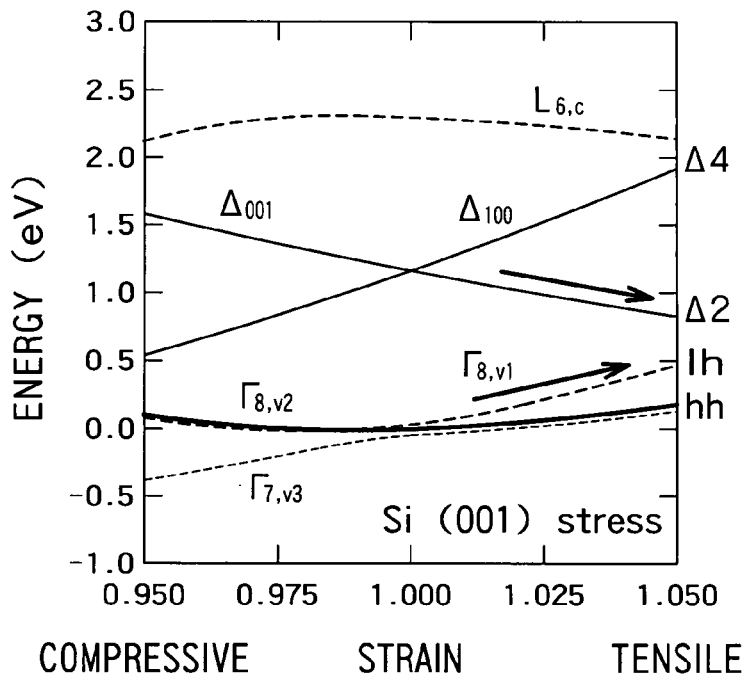
FIG. 2A is a diagram for illustrating a dependence of a band-edge energy on stress for silicon (Si)
Figure 2B:
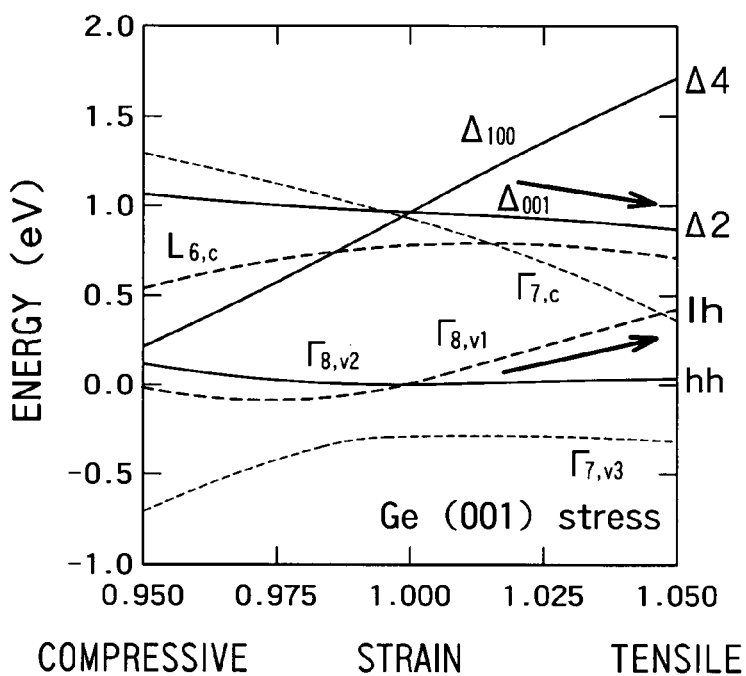
FIG. 2B is a diagram for illustrating a dependence of a band-edge energy on stress for germanium (Ge)

FIG. 2A is a diagram for illustrating a dependence of a band-edge energy on stress for silicon (Si). FIG. 2B is a diagram for illustrating a dependence of a band-edge energy on stress for germanium (Ge).

As shown in FIGS. 2A and 2B, the energy level of the 2-fold valley ($\Delta 2$) and the 4-fold valley ($\Delta 4$) is affected by a tensile strain.

In other words, it can be considered that the barrier height for the 2-fold valley (from a fermi level of the metal of source and drain) decreases, and the barrier height for the 4-fold valley increases.

Since the Schottky barrier height for the 2-fold valley having a smaller effective mass decreases, it can be considered that the driving current of the nMOS transistor increases.

As for holes, as shown in FIGS. 2A and 2B, when a tensile strain is applied, the energy level of the light-hole (lh) valley increases, while the energy level of the heavy-hole (hh) valley does not significantly change. Since the Schottky barrier height for the light-hole (lh) valley having a smaller effective mass decreases, it can be considered that the driving current of the pMOS transistor also increases.

As can be seen from FIGS. 2A and 2B, it is the tensile strain that is effective for reducing the Schottky barrier height of the pMOS transistor, and the compressive strain is not effective for reducing the Schottky barrier height.

Now, there will be described a reason why the direction of the tensile strain (the second <110> crystal orientation) and the channel direction ((the current flow direction), (the first <110> crystal orientation)) are made perpendicular in the structure described above.

Figure 3A:
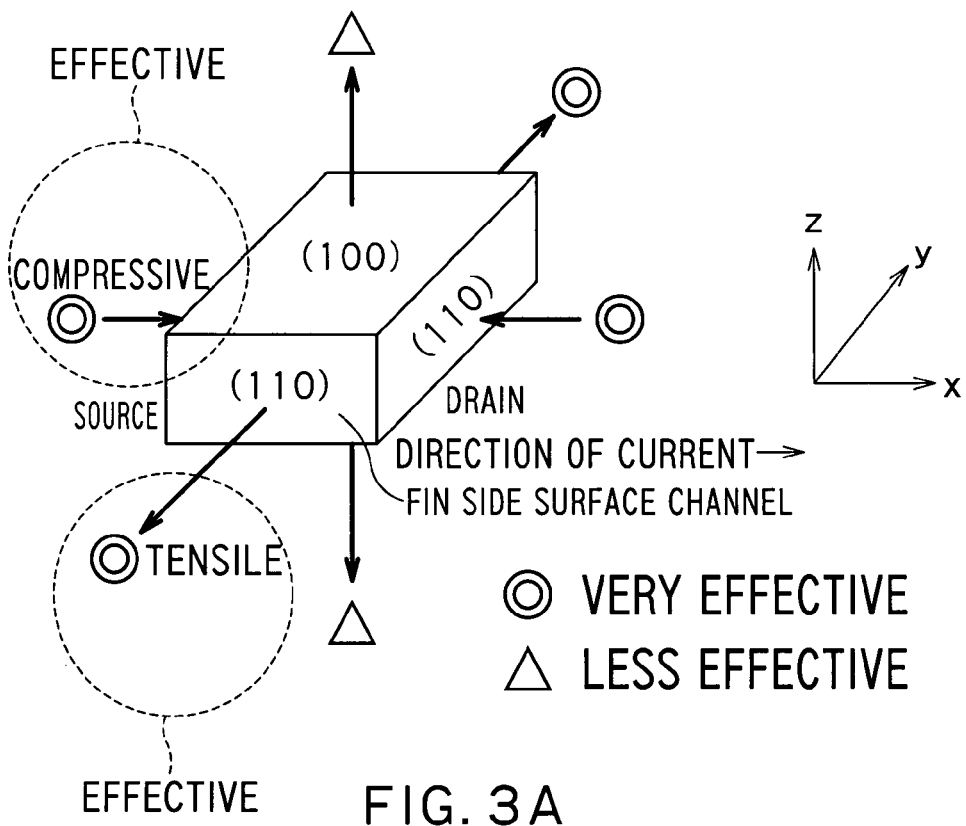
FIG. 3A shows a model for illustrating relationships between strain components and the effectiveness thereof in increasing the hole mobility in a pMOS transistor (Si channel)

FIG. 3A shows a model for illustrating relationships between strain components and the effectiveness thereof in increasing the hole mobility in a pMOS transistor (Si channel). In FIG. 3A, the crystal orientation of the top surface of the silicon is (100), and the channel direction (the current flow direction) <110> is perpendicular to the fin side surfaces (110).

As shown in FIG. 3A, in the pMOS transistor (Si channel), if the channel direction (the current flow direction) <110> and the direction of the tensile strain <110> are perpendicular to each other, the hole mobility is increased effectively. If the channel direction (the current flow direction) and the direction of the compressive strain are in parallel with each other, the hole mobility is also increased effectively.

Figure 3B:
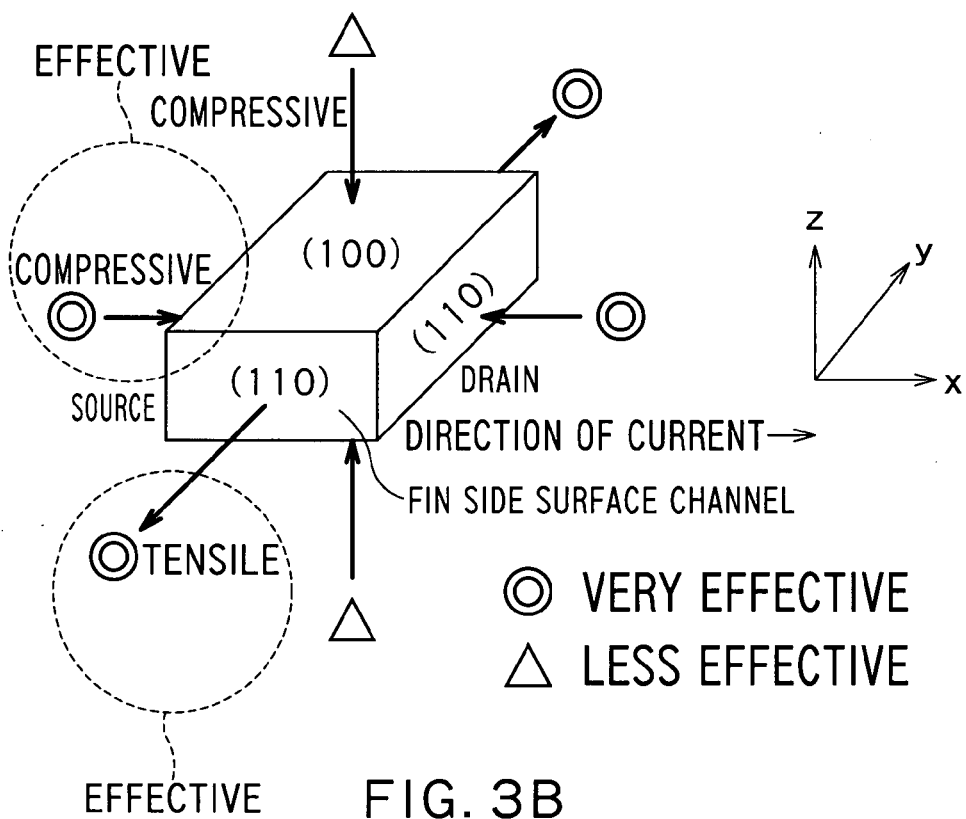
FIG. 3B shows a model for illustrating relationships between strain components and the effectiveness thereof in increasing the hole mobility in a pMOS transistor (Ge channel)

FIG. 3B shows a model for illustrating relationships between strain components and the effectiveness thereof in increasing the hole mobility in a pMOS transistor (Ge channel). In FIG. 3B, the crystal orientation of the top surface of the germanium is (100), and the channel direction (the current flow direction) <110> is perpendicular to the fin side surfaces (110).

As shown in FIG. 3B, in the pMOS transistor (Ge channel), if the channel direction (the current flow direction) <110> and the direction of the tensile strain <110> are perpendicular to each other, the hole mobility is increased effectively. If the channel direction (the current flow direction) and the direction of the compressive strain are in parallel with each other, the hole mobility is also increased effectively.

As described above, in the pMOS double-gate transistor having a channel the crystal orientation of the top surface of which is (100), regardless of whether the channel is a Si channel or a Ge channel, the hole mobility is effectively increased if the channel direction (the current flow direction) <110> and the direction of the tensile strain <110> are perpendicular to each other.

For the reason described above, in order to reduce the Schottky barrier height and to improve the hole mobility, the structure described above is used for the pMOSFinFET with Schottky source and drain.

In the following, there will be described a method of manufacturing the semiconductor device 100 having the pMOS double-gate structure described above.

Figure 4A:
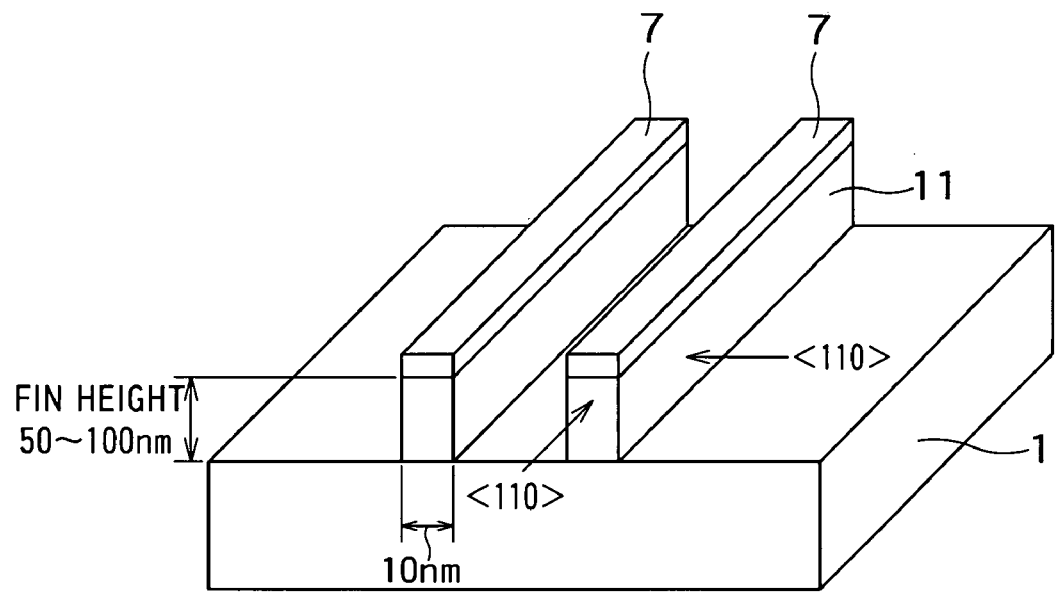
FIG. 4A is a perspective view for illustrating step of a method of manufacturing the semiconductor device 100 according to the embodiment 1 of the present invention.
Figure 4B:
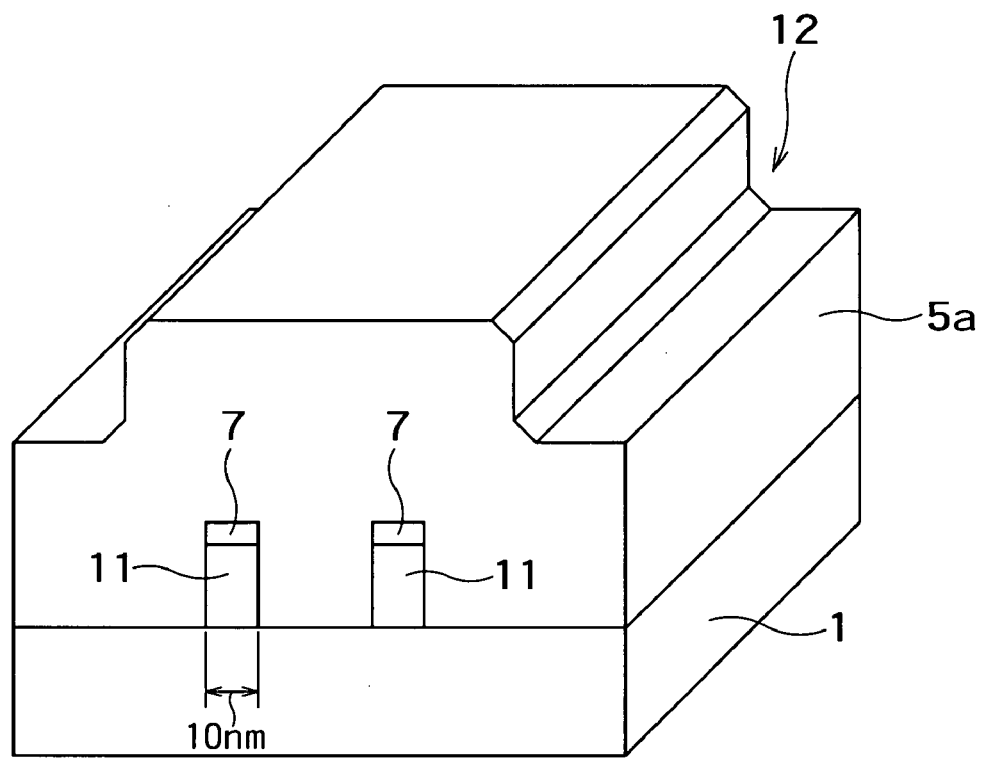
FIG. 4B is a perspective view for illustrating step of a method of manufacturing the semiconductor device 100 according to the embodiment 1 of the present invention.
Figure 5A:
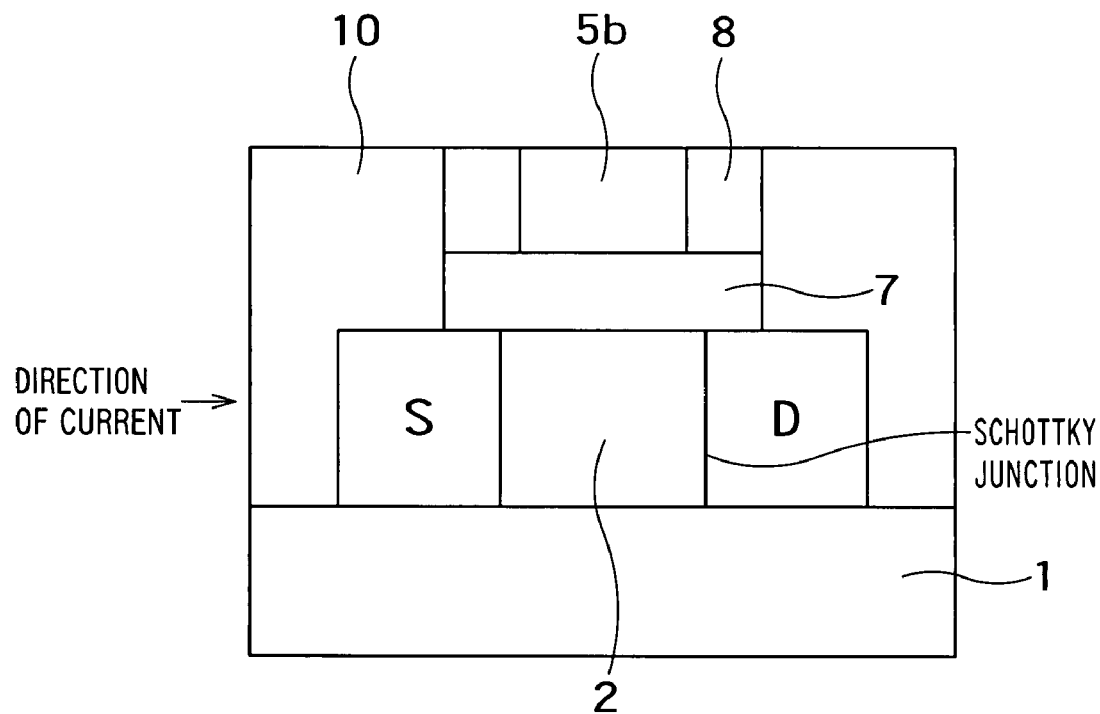
FIG. 5A is a cross-sectional view taken along the line A-A in FIG. 4J.
Figure 5B:
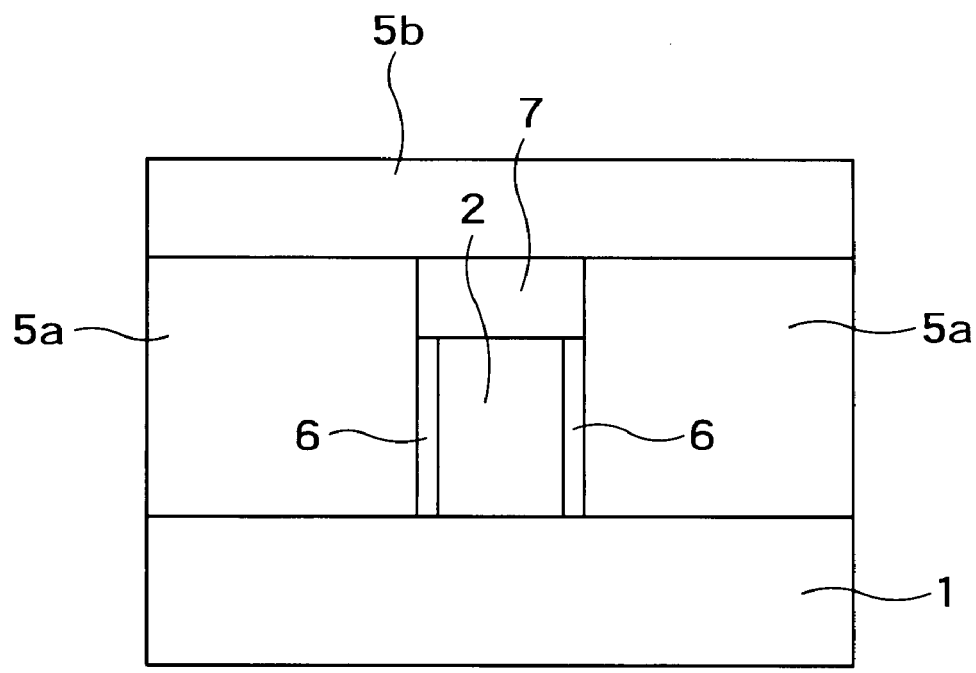
FIG. 5B is a cross-sectional view taken along the line B-B in FIG. 4J.
Figure 6A:
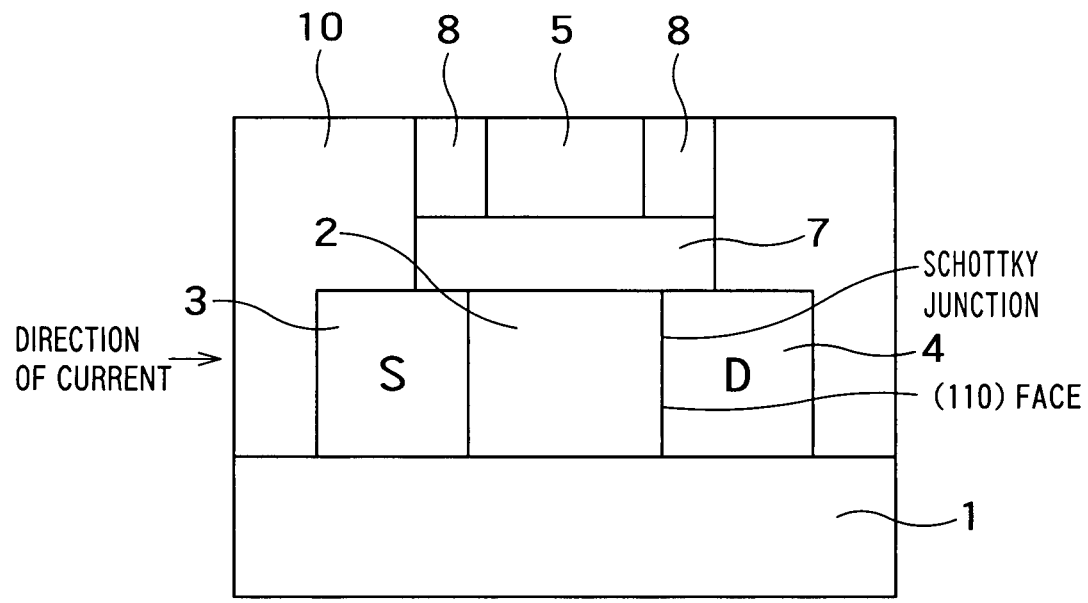
FIG. 6A is a cross-sectional view taken along the line A-A in FIG. 4K.
Figure 6B:
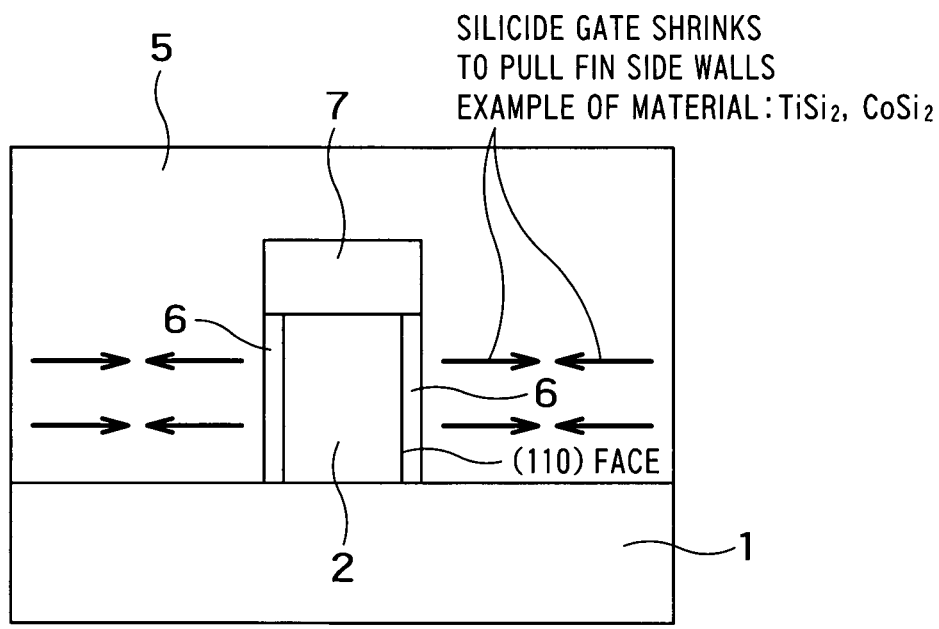
FIG. 6B is a cross-sectional view taken along the line B-B in FIG. 4K.

FIGS. 4A to 4K are perspective views for illustrating steps of a method of manufacturing the semiconductor device 100 according to the embodiment 1 of the present invention. FIG. 5A is a cross-sectional view taken along the line A-A in FIG. 4J. FIG. 5B is a cross-sectional view taken along the line B-B in FIG. 4J. FIG. 6A is a cross-sectional view taken along the line A-A in FIG. 4K. FIG. 6B is a cross-sectional view taken along the line B-B in FIG. 4K.

First, in the case where a fin 11 is made of silicon, an SOI substrate (BOX), the crystal orientation of the top surface of which is (100) is prepared, and the SOI is thinned to a thickness of 50 nm to 100 nm, for example. Alternatively, in the case where the fin 11 is made of germanium, a GOI substrate is prepared as described above.

Then, channel doping is performed in a body region that constitutes a semiconductor layer 2. In this example, the dose is adjusted so that the channel concentration is about $1 \times 10^{17}/cm^3$.

Then, a SiN hard mask 7 is deposited to have a thickness of about 70 nm. That is, the insulating film 7 is formed on the silicon (or germanium) on the substrate 1, the crystal orientation of the top surface of which is (100).

The SiN hard mask (insulating film) 7 is used for patterning and reactive ion etching (RIE) of the fin 11. The fin 11 extending in the first <110> crystal orientation is formed by etching of the silicon (or germanium) (FIG. 4A).

When the fin pattern is patterned in a direction parallel to or perpendicular to the notch direction (<110> direction) of the SOI substrate (GOI substrate), the side surfaces of the fin 11 is (110) crystal orientation.

Then, gate insulating films (not shown) are formed on the side surfaces of the fin 11, and a first gate polysilicon (Poly-Si) layer 5a is deposited to have a thickness of about 300 nm. In this step, since the polysilicon is deposited on the fin 11 protruding on the substrate 1, a large bump 12 is formed on the polysilicon surface (FIG. 4B).

Figure 4C:
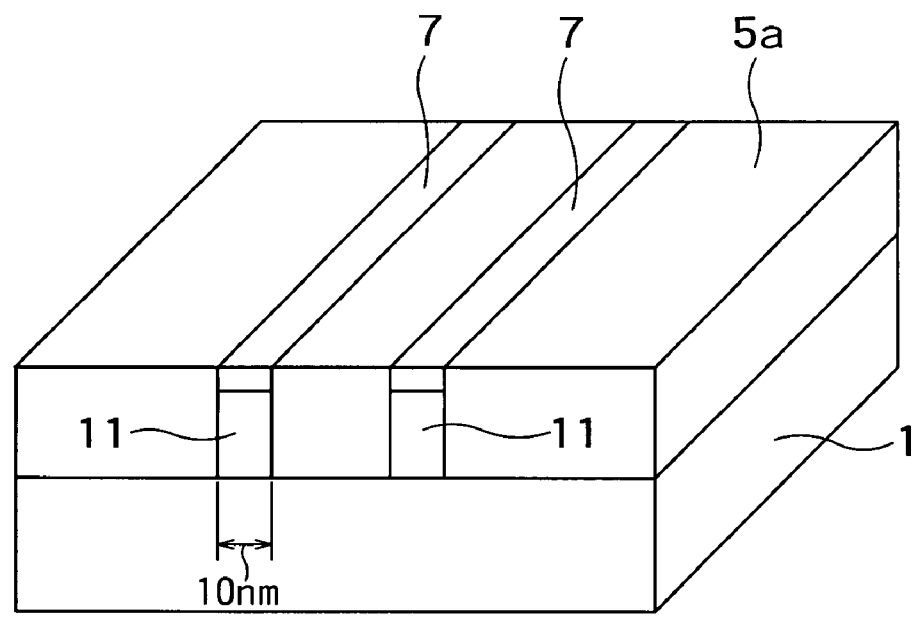
FIG. 4C is a perspective view for illustrating step of a method of manufacturing the semiconductor device 100 according to the embodiment 1 of the present invention.

Then, the polysilicon is planarized by chemical mechanical polishing (CMP) and etched back until the SiN hard mask 7 is exposed (FIG. 4C).

Figure 4D:
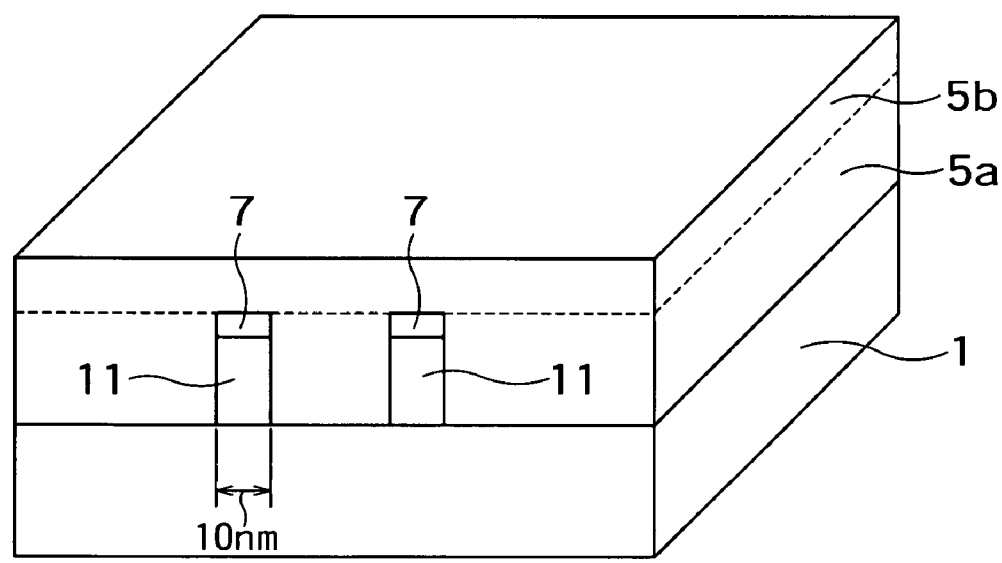
FIG. 4D is a perspective view for illustrating step of a method of manufacturing the semiconductor device 100 according to the embodiment 1 of the present invention.

Then, a second polysilicon layer 5b is deposited to have a thickness of about 50 nm (FIG. 4D). In the case where the gate electrode is formed by Full Silicidation (FUSI) process, the second polysilicon layer 5b and the first polysilicon layer 5a constitute a gate electrode 5 in combination.

Figure 4E:
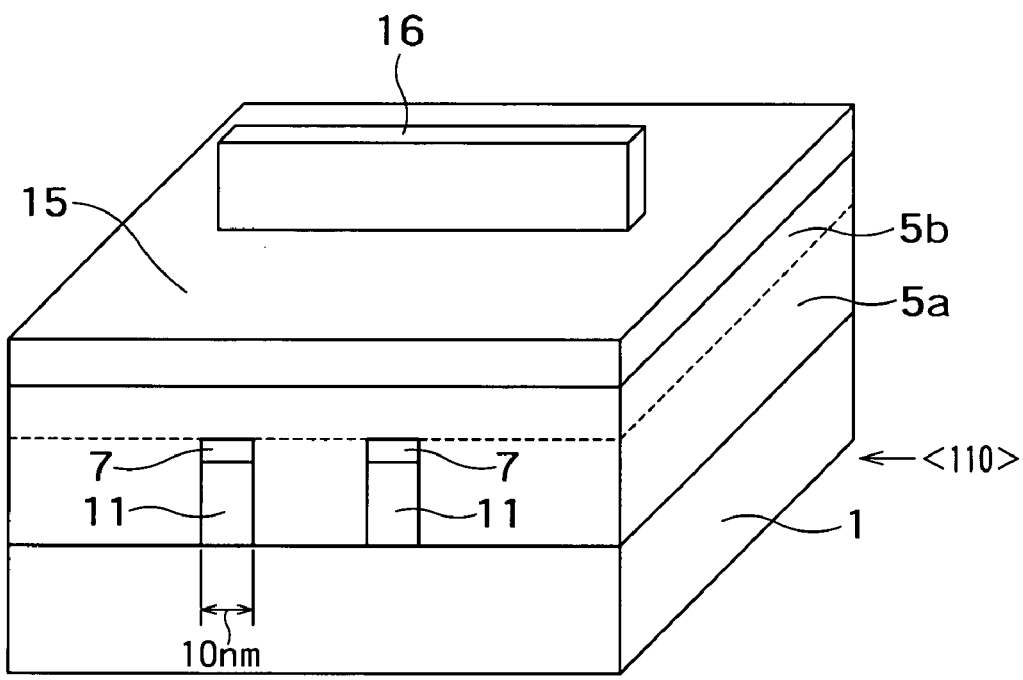
FIG. 4E is a perspective view for illustrating step of a method of manufacturing the semiconductor device 100 according to the embodiment 1 of the present invention.

Then, a SiN hard mask 15 is deposited on the second polysilicon layer 5b as a hard mask to a thickness of about 100 nm, and a resist or hard mask 16 for forming a gate pattern perpendicular to the fin 11 is disposed (FIG. 4E).

Figure 4F:
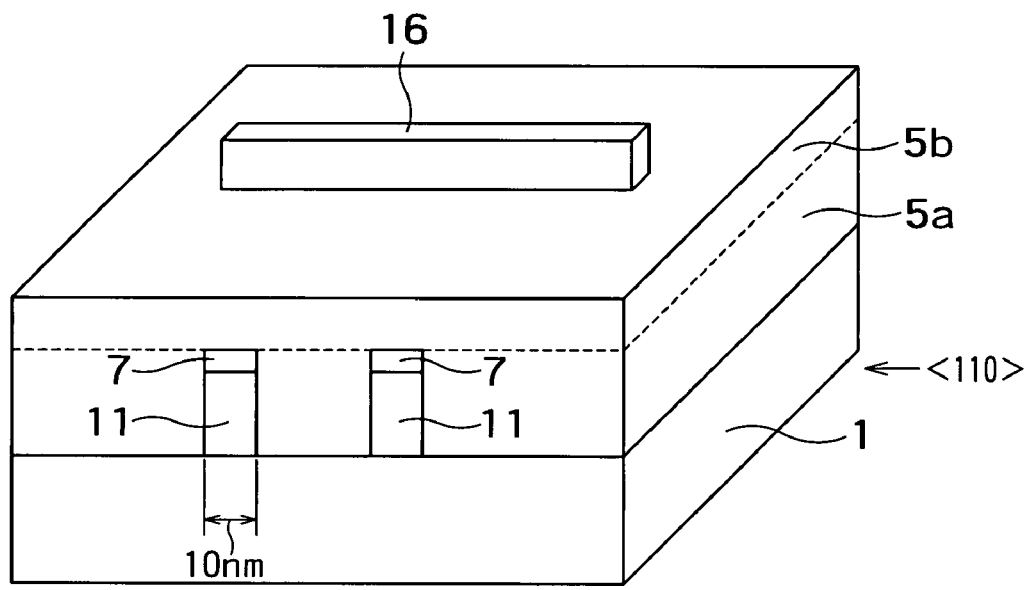
FIG. 4F is a perspective view for illustrating step of a method of manufacturing the semiconductor device 100 according to the embodiment 1 of the present invention.

Then, the SiN hard mask 15 is subjected to the RIE process, thereby forming the SiN hard mask 16 for a gate patterning on the polysilicon layer 5b (FIG. 4F).

Figure 4G:
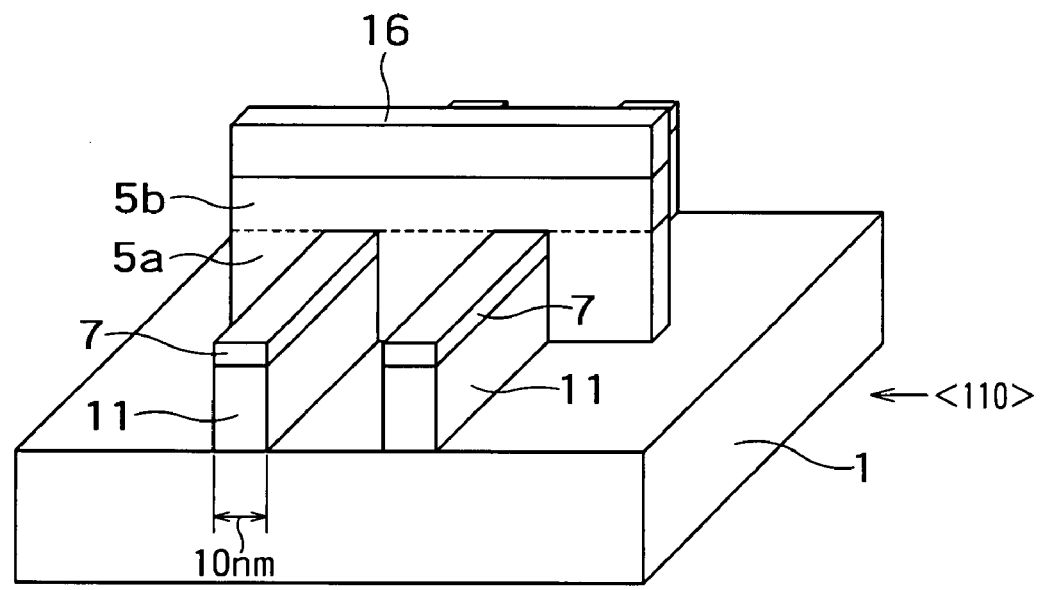
FIG. 4G is a perspective view for illustrating step of a method of manufacturing the semiconductor device 100 according to the embodiment 1 of the present invention.

Then, the polysilicon layers 5a and 5b are subjected to the RIE process, thereby forming a gate pattern. Specifically, the polysilicon layers 5a and 5b are shaped to extend in the second <110> direction perpendicular to the first <110> direction on the SiN hard mask (insulating film) 7 over the part of the fin 11 that is to form the semiconductor layer 2 (channel region) and the substrate 1 (FIG. 4G).

Figure 4H:
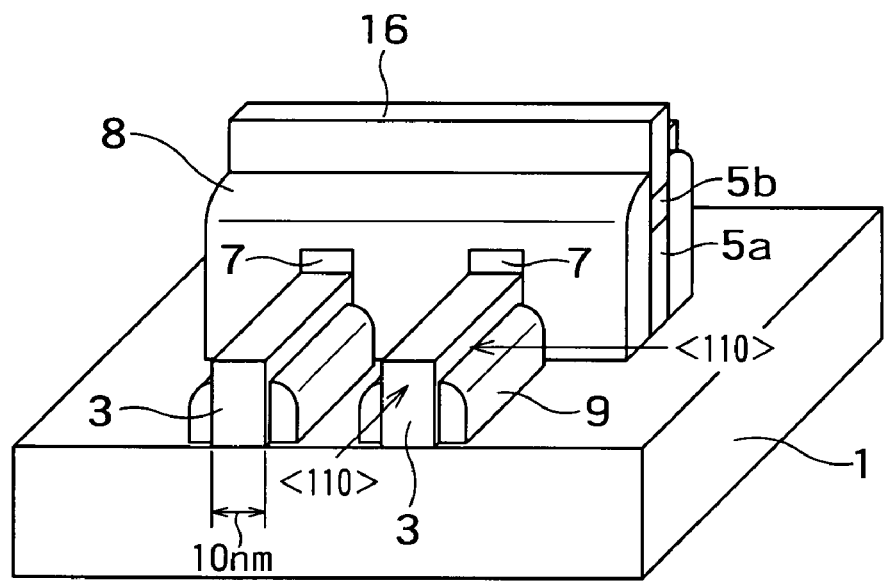
FIG. 4H is a perspective view for illustrating step of a method of manufacturing the semiconductor device 100 according to the embodiment 1 of the present invention.
Figure 41:
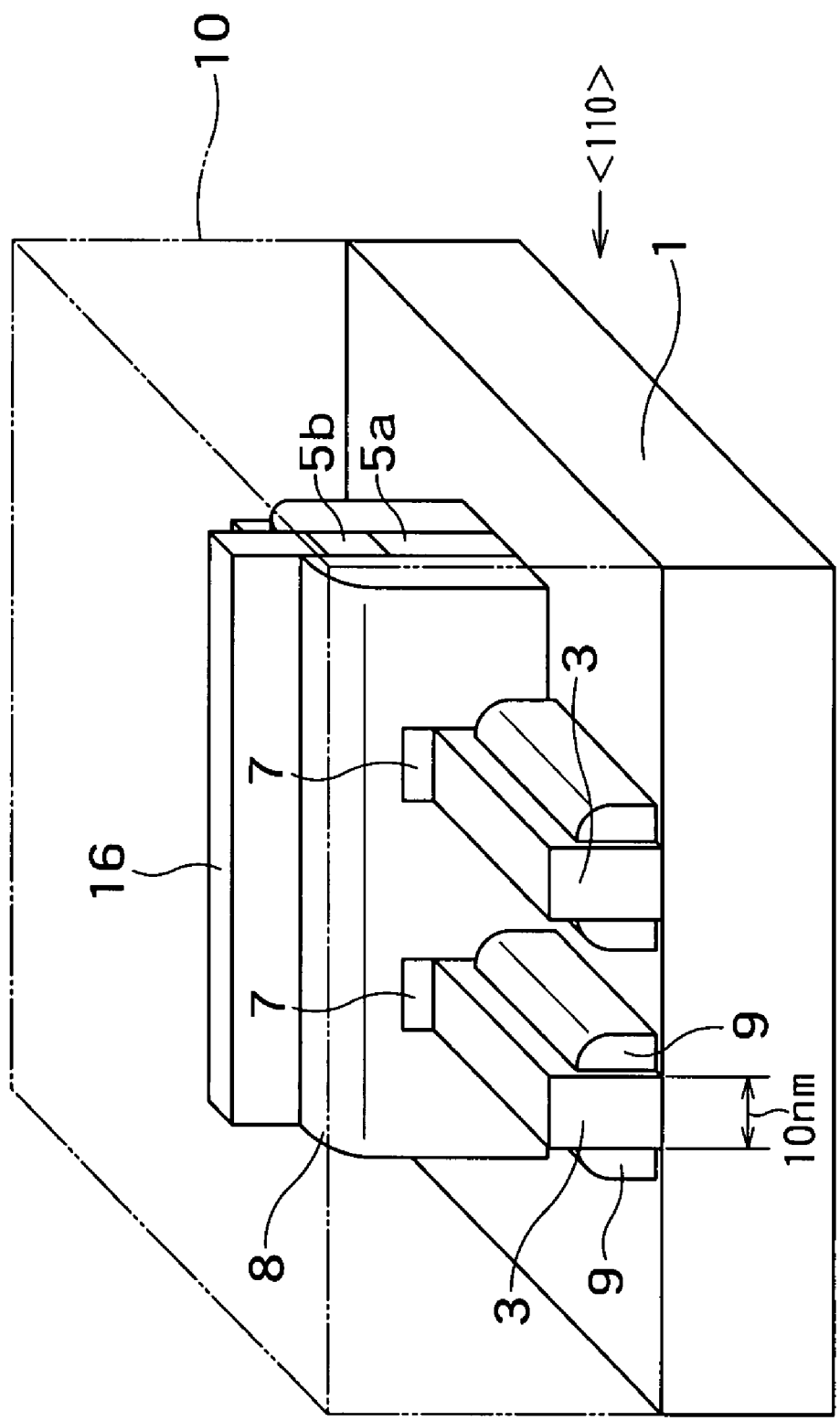

Then, a material (TEOS, for example) to form gate side walls is deposited over the entire surface and then etched back. In this way, gate side walls (TEOS films) 8 having a thickness of about 40 nm are formed (FIG. 4H).

Furthermore, the SiN hard mask is subjected to the RIE process to remove the SiN hard mask 7 on the fin 11. Specifically, the SiN hard mask (insulating film) 7 exposed on the fin 11 is selectively removed (FIG. 4H). In this step, the SiN hard mask 16 on the polysilicon layer 5b is left by adjusting the etching condition and the SiN thickness.

Then, silicide formation is performed in the parts of the fin 11 that are to form the source region and the drain region to form Schottky junctions with the semiconductor layer 2. Specifically, the parts of the fin 11 from which the insulating film 7 is removed are selectively silicided, thereby forming a source layer 3 and a drain layer 4, Schottky junctions is formend between source/drain and the semiconductor layer 2 (FIG. 4I). The silicide material for the source and the drain of the PMOS transistor may be PtSi, for example.

Alternatively, for example, in the case of forming an nMOS transistor, ErSi can be used.

In addition, the process conditions are controlled to prevent the source layer 3 and the drain layer 4 from applying a strain to the semiconductor layer 2. The polysilicon layers 5a and 5b constituting the gate electrode 5 is covered with the SiN hard mask 16 and the gate side walls 8 and therefore are not silicided in this step.

Then, TEOS or the like to form an interlayer insulating film 10 is deposited to have a thickness of about 400 nm and then planarized by the CMP process (FIG. 4I).

Figure 4J:
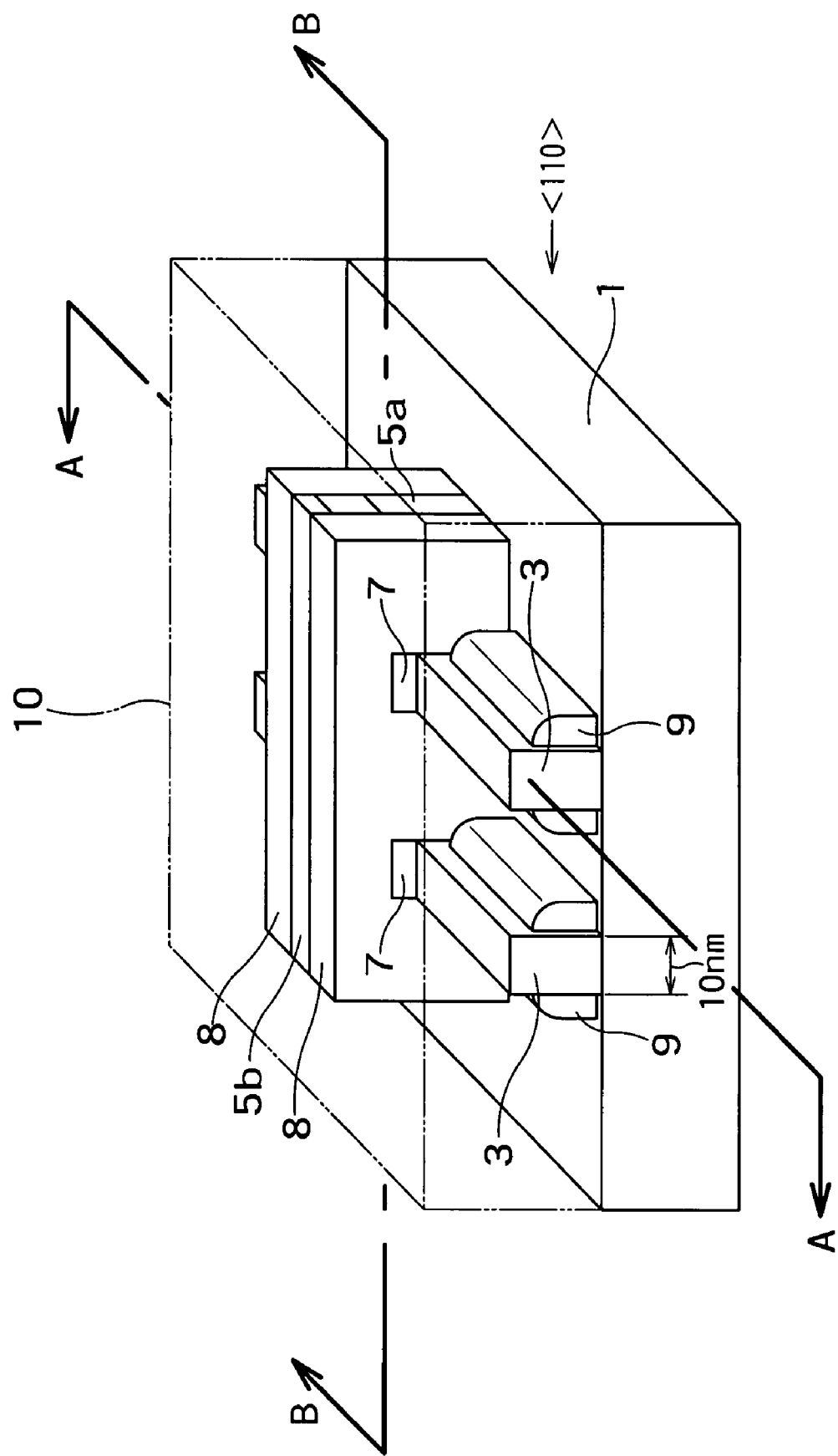
FIG. 4J is a perspective view for illustrating step of a method of manufacturing the semiconductor device 100 according to the embodiment 1 of the present invention.

The interlayer insulating film 10 is etched back over the entire surface to expose the SiN hard mask 16. Furthermore, the remaining SiN hard mask 16 is removed with hot phosphoric acid, thereby exposing the top surface of the polysilicon layer 5b (FIGS. 4J, 5A, 5B).

Figure 4K:
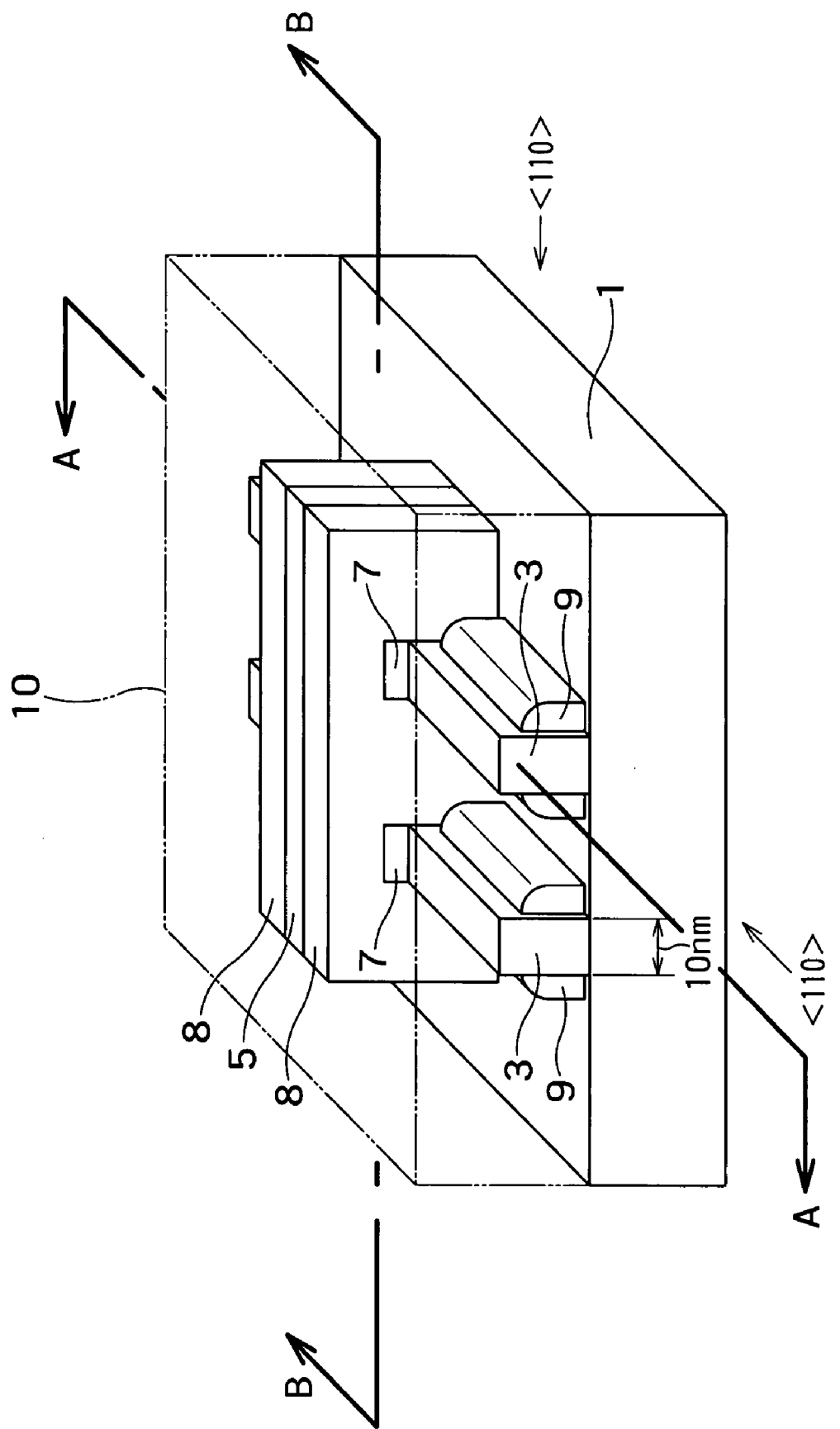
FIG. 4K is a perspective view for illustrating step of a method of manufacturing the semiconductor device 100 according to the embodiment 1 of the present invention.

Then, the polysilicon layers 5a and 5b are silicided from top surfaces thereof. Specifically, the polysilicon layers 5a and 5b are selectively silicided, thereby forming the gate electrode 5 made of a shrinkable material (FIGS. 4K, 6A, 6B). The gate suicide material may be $TiSi_2$ or $CoSi_2$, which are shrinkable materials.

As described above, the gate, the source and the drain of the FinFET can be silicided, and the silicidation of the gate and the silicidation of the source and the drain can be performed in independent steps.

Therefore, the source and the drain can be prevented from being silicided too deeply (from being excessively grown in the lateral direction).

Furthermore, since $TiSi_2$ (or $CoSi_2$) is a shrinkable material (a material having a higher coefficient of thermal expansion than silicon), a tensile strain is applied to the fin side surfaces ((110) faces) depending on the process conditions (FIG. 6B). At this time, a compressive strain occurs in the current flow direction in accordance with the Poisson's ratio.

However, the strain applied from the source layer 3 and the drain layer 4 is reduced so that any compressive strain other than that compressive strain does not occur due to a process strain. Of course, a stressor technique, such as an element structure containing SiGe with a compressive strain in the source and drain regions (e-SiGe), is not used.

Since the semiconductor layer 2 (in particular a long channel) in the fin 11 is unlikely to is subjected to the strain from the source layer 3 and the drain layer 4, it is advantageous for the pMOS double-gate transistor (pMOS-FinFET).

Since $TiSi_2$ is a shrinkable material, according to this embodiment, a tensile strain is applied to the fin side surfaces ((110) surfaces) of the pMOS transistor.

Thus, the mobility of the pMOS double-gate transistor (pMOS-FinFET) is improved, and the contact resistance of the Schottky source and drain is reduced.

In addition, since the strain in the gate electrode 5 is used, the tensile strain can be easily and efficiently applied to the semiconductor layer 2 in the fin 11.

Furthermore, since the FUSI technique is used, the silicide gate can be formed relatively easily.

As described above, the semiconductor device manufacturing method according to this embodiment can provide improvement in hole mobility and reduction in Schottky barrier height (contact resistance), and the semiconductor device according to this embodiment can have an improved hole mobility and a reduced Schottky barrier height (contact resistance).

Embodiment 2

With regard to the embodiment 1, a method of manufacturing a semiconductor device in which the silicide gate is formed by the FUSI technique is mentioned.

With regard to an embodiment 2, there will be described a method of manufacturing a semiconductor device in which the damascene gate technique is used, and a material other than silicide, such as pure metal, is used for forming the gate.

Figure 7A:
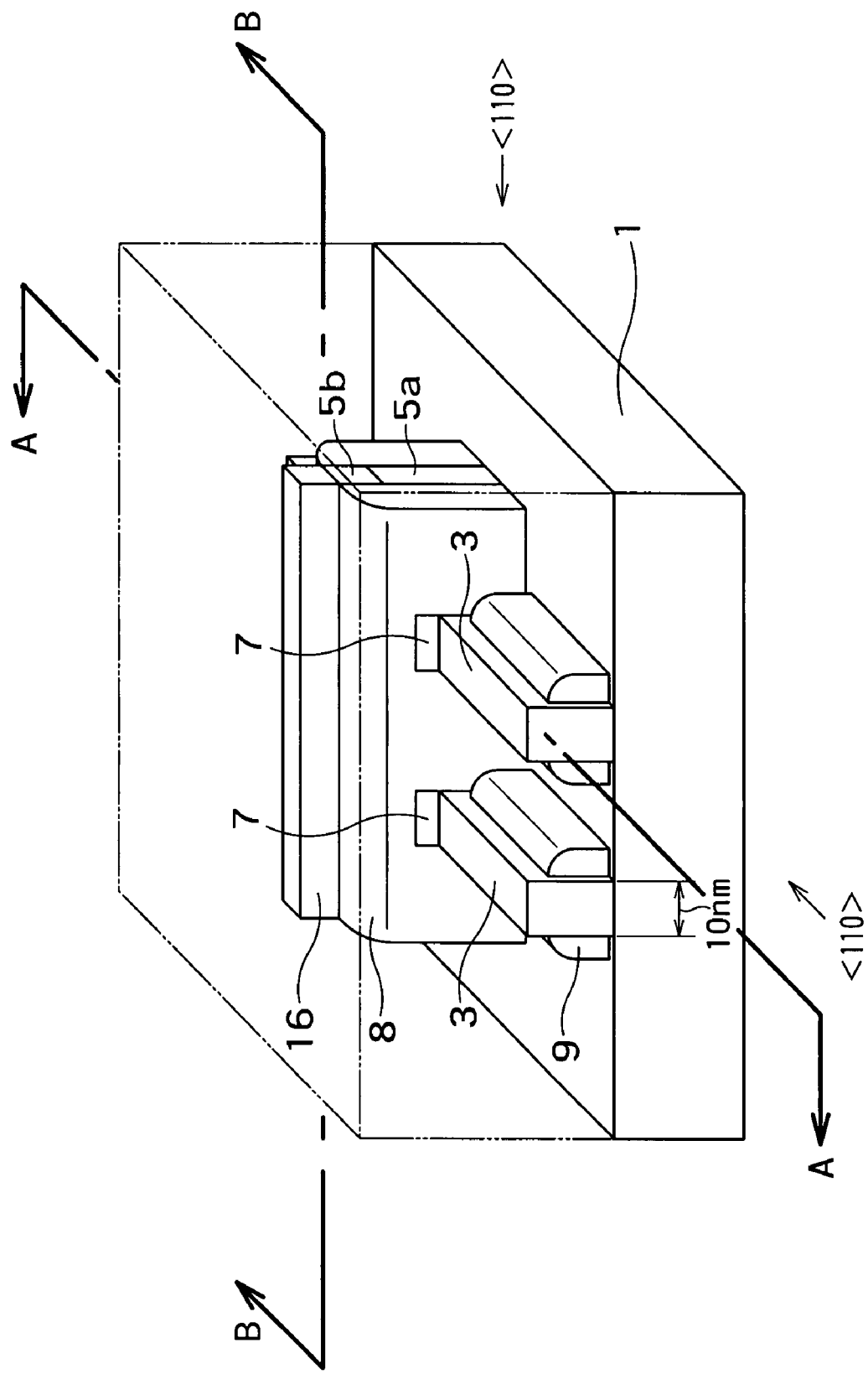
FIG. 7A is a perspective view for illustrating step of a method of manufacturing a semiconductor device 200 according to the embodiment 2 of the present invention.
Figure 7B:
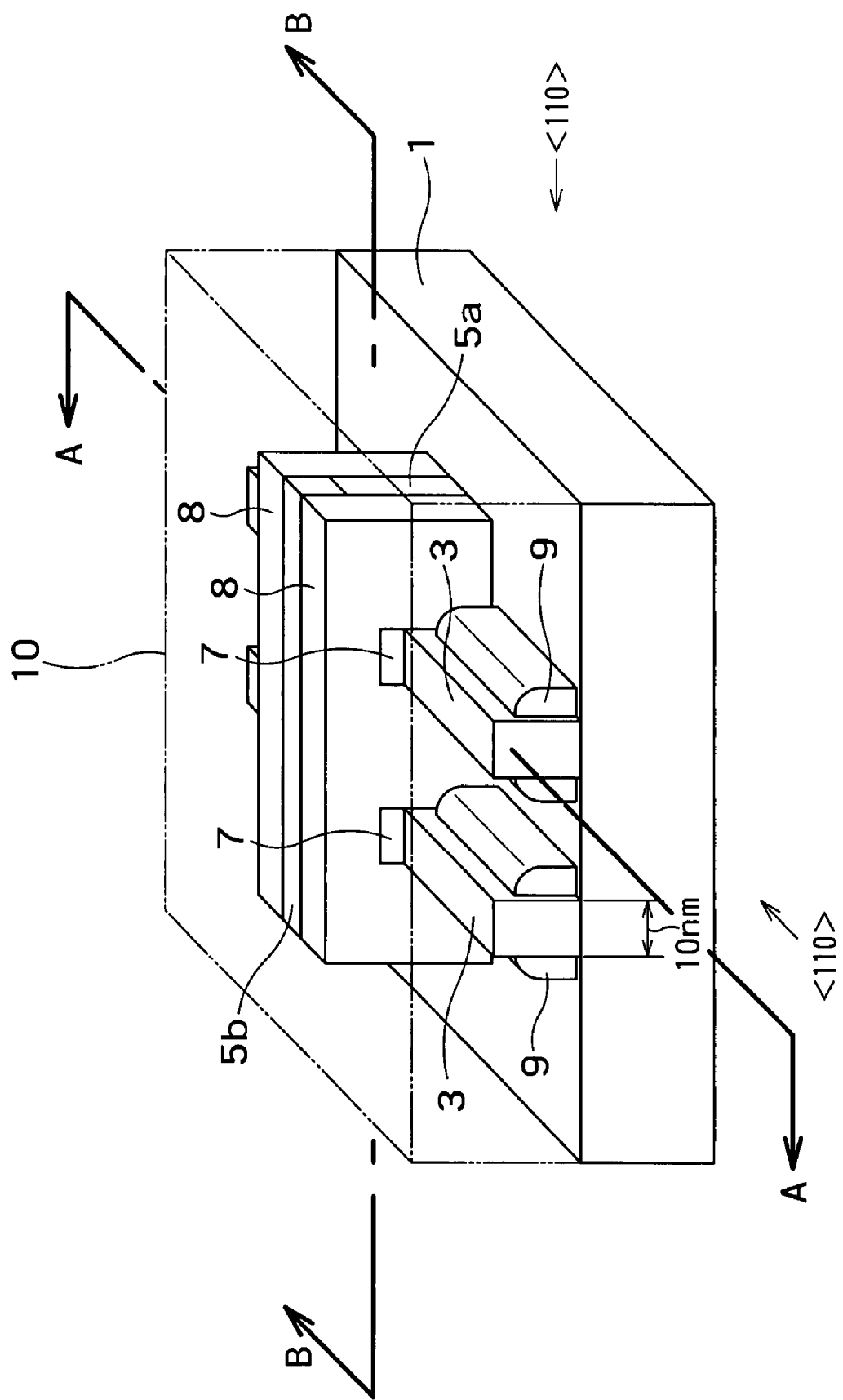
FIG. 7B is a perspective view for illustrating step of a method of manufacturing a semiconductor device 200 according to the embodiment 2 of the present invention.
Figure 8A:
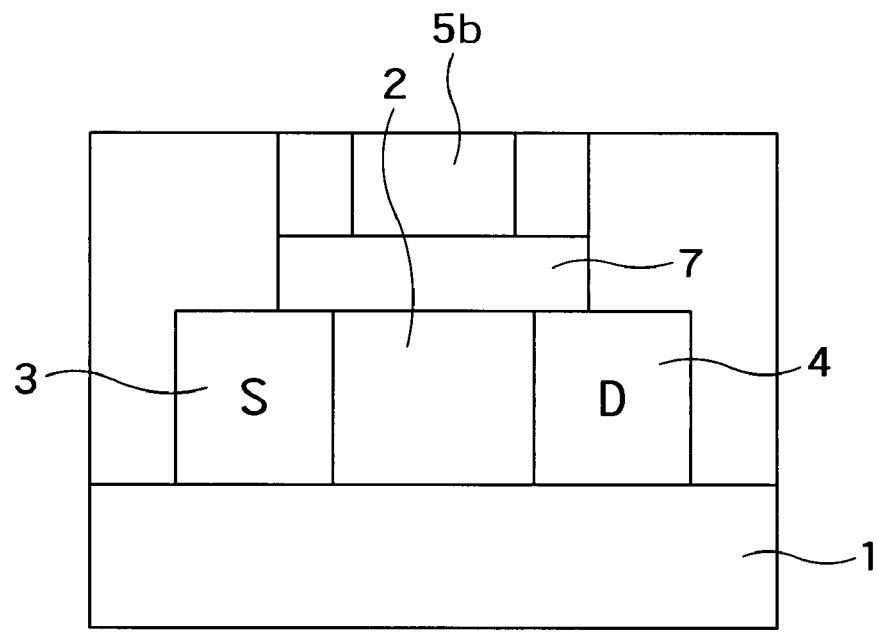
FIG. 8A is a cross-sectional view taken along the line A-A in FIG. 7B.
Figure 8B:
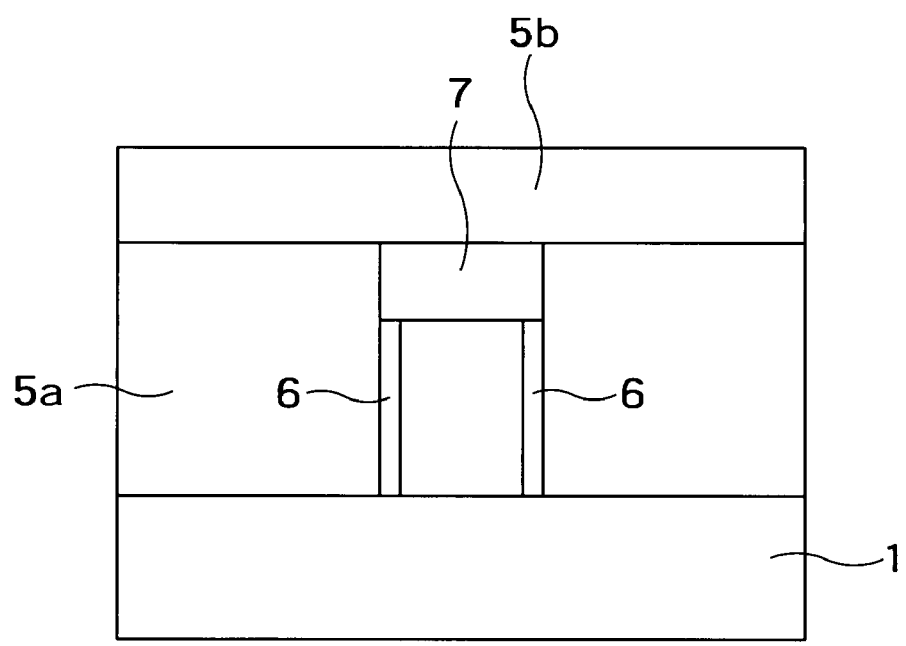
FIG. 8B is a cross-sectional view taken along the line B-B in FIG. 7B.

FIGS. 7A and 7B are perspective views for illustrating steps of a method of manufacturing a semiconductor device 200 according to the embodiment 2 of the present invention. FIG. 8A is a cross-sectional view taken along the line A-A in FIG. 7B. FIG. 8B is a cross-sectional view taken along the line B-B in FIG. 7B.

Figure 9A:
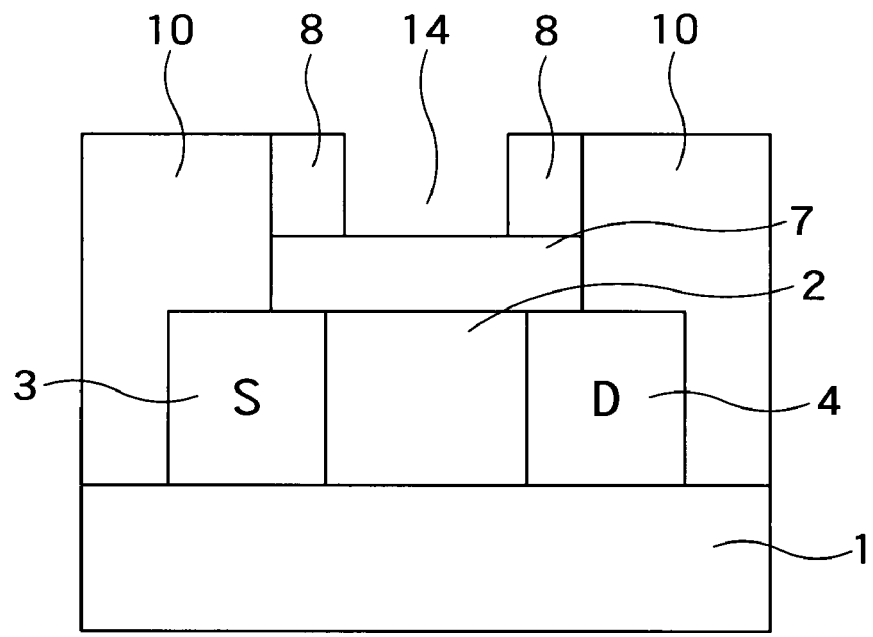
FIG. 9A is a cross-sectional view of the semiconductor device 200 after the step shown in FIG. 8A taken along the line A-A.
Figure 9B:
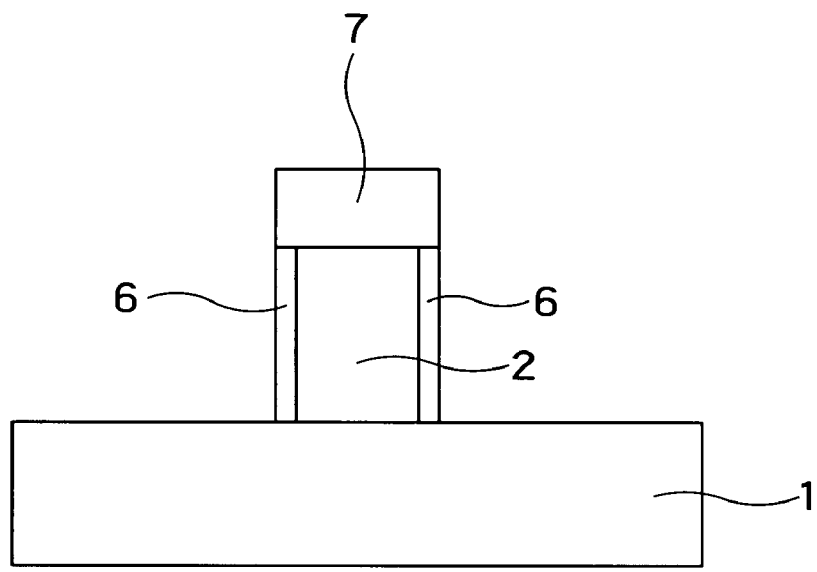
FIG. 9B is a cross-sectional view of the semiconductor device 200 after the step shown in FIG. 8A taken along the line B-B.

FIG. 9A is a cross-sectional view of the semiconductor device 200 after the step shown in FIG. 8A taken along the line A-A. FIG. 9B is a cross-sectional view of the semiconductor device 200 after the step shown in FIG. 8A taken along the line B-B.

Figure 10A:
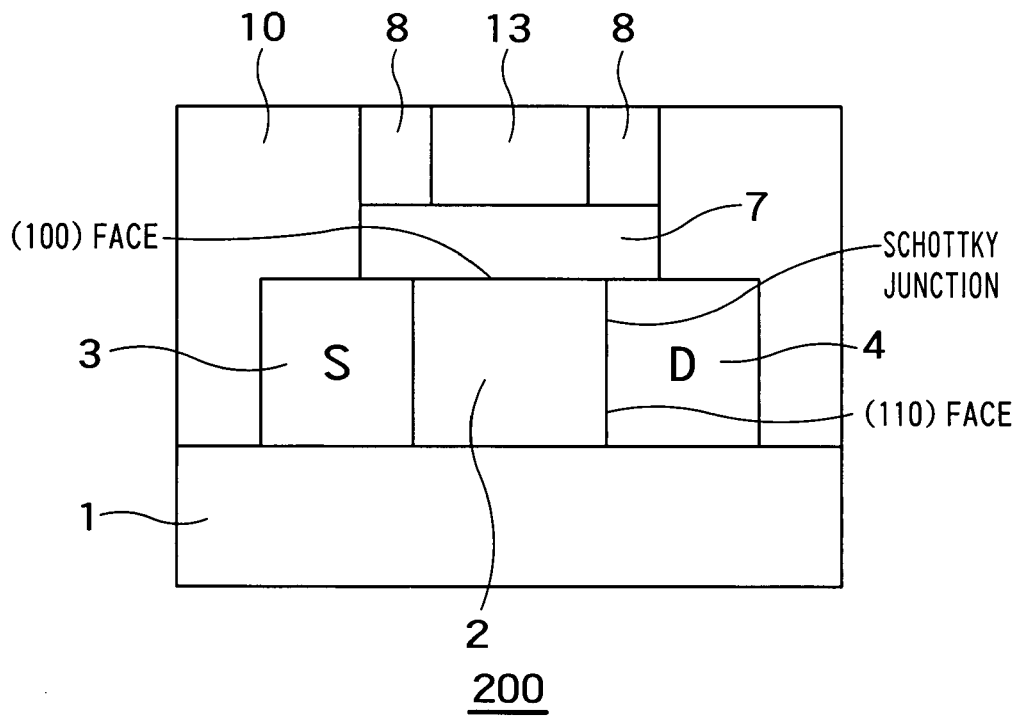
FIG. 10A is a cross-sectional view of the semiconductor device 200 after the step shown in FIG. 9A taken along the line A-A.
Figure 10B:
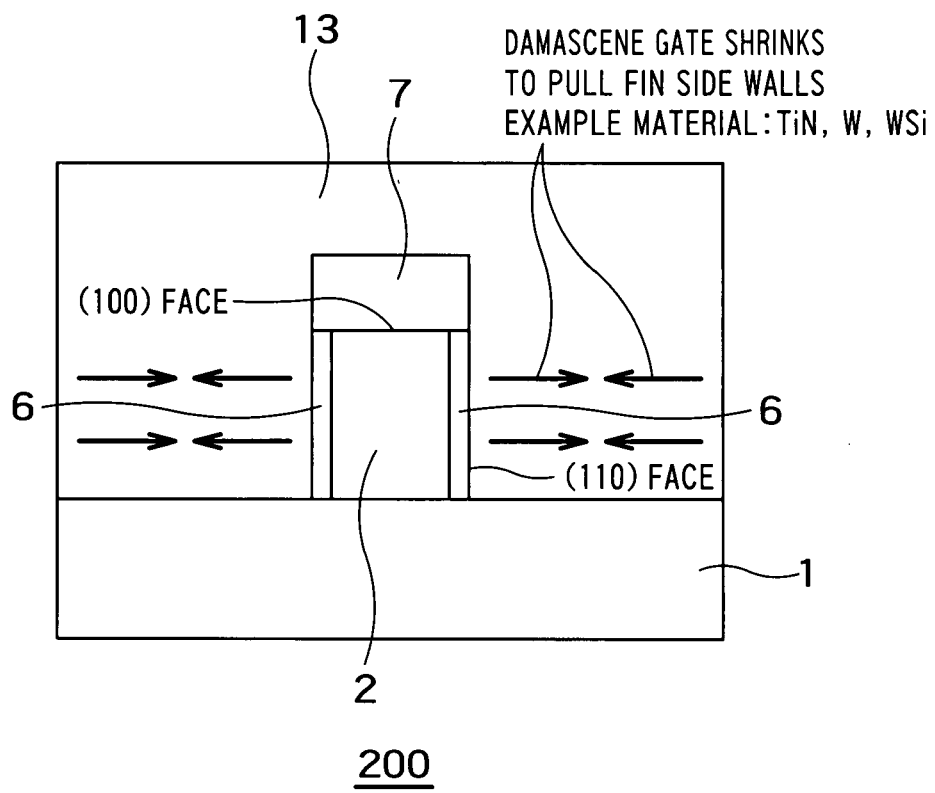
FIG. 10B is a cross-sectional view of the semiconductor device 200 after the step shown in FIG. 9A taken along the line B-B.

FIG. 10A is a cross-sectional view of the semiconductor device 200 after the step shown in FIG. 9A taken along the line A-A. FIG. 10B is a cross-sectional view of the semiconductor device 200 after the step shown in FIG. 9A taken along the line B-B.

In the drawings, the same reference numerals as those in the embodiment 1 denote the same parts as those in the embodiment 1.

The method of manufacturing the semiconductor device according to the embodiment 2 is the same as the method according to the embodiment 1 up to the step shown in FIG. 4J.

Through the same steps as those shown in FIGS. 4A to 4I in the embodiment 1, a source layer 3 and a drain layer 4 are formed, Schottky junctions are formed, and then TEOS or the like is deposited to have a thickness of about 400 nm to form an interlayer insulating film 10, and the interlayer insulating film 10 is planarized by the CMP process (FIG. 7A).

The same step as the step shown in FIG. 4J in the embodiment 1 is carried out to etch back the interlayer insulating film 10 over the entire surface thereof, thereby exposing a SiN hard mask 16. Furthermore, the SiN hard mask is removed with hot phosphoric acid, for example, thereby exposing the top surface of a polysilicon layer 5b (FIGS. 7B, 8A and 8B).

Then, the polysilicon layers 5a and 5b disposed between gate side walls 8 are selectively removed by chemical dry etching (CDE) or the like (FIGS. 9A and 9B).

Then, a gate groove defined by the gate side walls 8 is filled with a shrinkable material by the damascene method, thereby forming a gate electrode 13 made of the shrinkable material (FIGS. 10A and 10B).

Specifically, the gate material is deposited over the entire surface and then planarized by the CMP process to leave the gate material only in the gate groove. In this embodiment, as the gate material for a pMOS transistor, TiN, W or WSi, which are shrinkable, may be used.

In this way, the semiconductor device 200 having the gate electrode 13 made of a metal, such as TiN, W and WSi, which replaces the gate electrode 5 of the semiconductor device 100 shown in FIG. 1A, is completed.

Since TiN, W and WSi are shrinkable as described above, a tensile stress is applied to the side surfaces ((110) surfaces) of the fin 11 of the pMOS double-gate transistor.

Thus, the hole mobility of the pMOS double-gate transistor is improved, and the contact resistance of the Schottky source and drain is reduced.

Since the strain in the gate electrode is used, a tensile strain can be readily applied to the semiconductor layer in the fin.

Furthermore, since the damascene gate technique is used, a material other than silicide, such as pure metal, can be used for the gate electrode.

If the damascene gate process is used, a gate material other than the material for the pMOS transistor can be filled for forming an nMOS transistor, for example.

As described above, the semiconductor device manufacturing method according to this embodiment can provide improvement in hole mobility and reduction in Schottky barrier height (contact resistance), and the semiconductor device according to this embodiment can have an improved hole mobility and a reduced Schottky barrier height (contact resistance).

What is claimed is:

1. A semiconductor device that has a pMOS double-gate structure, comprising:
   a substrate, the crystal orientation of the top surface of which is (100);
   a semiconductor layer that is made of silicon or germanium, formed on the substrate such that currents flow in a direction of a first <110> crystal orientation, and channels are located at a sidewall of the semiconductor layer;
   a source layer that is formed on the substrate adjacent to one end of the semiconductor layer in the direction of the first <110> crystal orientation and is made of a metal or metal silicide to form a Schottky junction with the semiconductor layer;
   a drain layer that is formed on the substrate adjacent to the other end of the semiconductor layer in the direction of the first <110> crystal orientation and is made of a metal or metal silicide to form a Schottky junction with the semiconductor layer;

a gate electrode that is formed on the semiconductor layer in a direction of a second <110> crystal orientation perpendicular to the current flow direction; and a gate insulating film that is disposed between the semiconductor layer and the gate electrode, wherein a uniaxial tensile strain is applied to the semiconductor layer in the direction of the second <110> crystal orientation perpendicular to the current flow direction, and the gate electrode contains a shrinkable material and the shrinkability causes the uniaxial tensile strain applied to the side wall of the semiconductor layer in the direction of the second <110> crystal orientation perpendicular to the current flow direction, the gate electrode having conductivity.

2. The semiconductor device according to claim 1, wherein the substrate is an SOI substrate in the case where the semiconductor layer is made of silicon or a GOI substrate in the case of the semiconductor layer is made of germanium.

3. The semiconductor device according to claim 1, wherein the shrinkable material is any of TiSi$_2$, CoSi$_2$, TiN, W and WSi.

4. The semiconductor device according to claim 3, wherein the substrate is an SOI substrate in the case where the semiconductor layer is made of silicon or a GOI substrate in the case of the semiconductor layer is made of germanium.

5. A method of manufacturing a semiconductor device having a pMOS double-gate structure, comprising:

forming an insulating film on silicon or germanium layer formed on a substrate, the crystal orientation of the top surface of which is (100), selectively etching silicon or germanium to form a fin that extends in a direction of a first <110> crystal orientation, forming a gate insulating film on a side wall of the fin, forming a polysilicon layer that that extends in a direction of a second <110> crystal orientation perpendicular to the direction of the first <110> crystal orientation on a part of the insulating film on channel region, removing the insulating film exposed on the fin, selectively siliciding a part of the fin from which the insulating film is removed, thereby forming, in the fin, a source layer and a drain layer that form Schottky junctions with the semiconductor layer; and selectively siliciding the polysilicon layer to form a gate electrode made of a shrinkable material.

6. The method of manufacturing a semiconductor device according to claim 5, wherein the substrate is an SaI substrate in the case where the semiconductor layer is made of silicon or a GOI substrate in the case of the semiconductor layer is made of germanium.

7. The method of manufacturing a semiconductor device according to claim 5, wherein the shrinkable material is any of TiSi$_2$, and CoSi$_2$.

8. The method of manufacturing a semiconductor device according to claim 7, wherein the substrate is an SOI substrate in the case where the semiconductor layer is made of silicon or a GOI substrate in the case of the semiconductor layer is made of germanium.

9. A method of manufacturing a semiconductor device having a pMOS double-gate structure, comprising:

forming an insulating film on silicon or germanium formed on a substrate, the crystal orientation of the top surface of which is (100), selectively etching silicon or germanium to form a fin that extends in a direction of a first <110> crystal orientation, forming a gate insulating film on a side wall of the fin, forming a polysilicon layer that extends in a direction of a second <110> crystal orientation perpendicular to the direction of the first <110> crystal orientation on a part of the insulating film on channel region, forming insulating gate side walls on side walls of the polysilicon layer, removing the insulating film exposed on the fin, selectively siliciding a part of the fin where the insulating film is removed, thereby forming, in the fin, a source layer and a drain layer, Schottky junctions is formed between source/drain and the semiconductor layer, depositing an interlayer insulating film and etching back the interlayer insulating film to expose the top surface of the polysilicon layer, selectively removing the polysilicon layer, and filling a shrinkable material into a gate groove defined by the gate side walls to form a gate electrode.

10. The method of manufacturing a semiconductor device according to claim 9, wherein the substrate is an SOI substrate in the case where the semiconductor layer is made of silicon or a GOI substrate in the case of the semiconductor layer is made of germanium.

11. The method of manufacturing a semiconductor device according to claim 9, wherein the shrinkable material is any of TiN, W and WSi.

12. The method of manufacturing a semiconductor device according to claim 11, wherein the substrate is an SOI substrate in the case where the semiconductor layer is made of silicon or a GOI substrate in the case of the semiconductor layer is made of germanium.

* * * * *